United States Patent
Yamamoto et al.

(10) Patent No.: US 8,860,000 B2
(45) Date of Patent: Oct. 14, 2014

(54) NONVOLATILE SEMICONDUCTOR MEMORY DEVICE AND METHOD OF MANUFACTURING THE SAME

(75) Inventors: Kazuhiko Yamamoto, Yokohama (JP); Takuya Konno, Palo Alto, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 370 days.

(21) Appl. No.: 13/019,630

(22) Filed: Feb. 2, 2011

(65) Prior Publication Data

US 2011/0198556 A1    Aug. 18, 2011

(30) Foreign Application Priority Data

Feb. 16, 2010  (JP) .................................. 2010-030855

(51) Int. Cl.
*H01L 47/00* (2006.01)
*H01L 27/24* (2006.01)
*H01L 45/00* (2006.01)

(52) U.S. Cl.
CPC .......... *H01L 45/085* (2013.01); *H01L 27/2409* (2013.01); *H01L 27/2463* (2013.01); *H01L 45/149* (2013.01); *H01L 45/1658* (2013.01)
USPC .......................................................... 257/1

(58) Field of Classification Search
USPC ....................................................... 257/2–4
See application file for complete search history.

(56) References Cited

U.S. PATENT DOCUMENTS

| | | | | |
|---|---|---|---|---|
| 8,334,525 | B2* | 12/2012 | Nakai et al. | 257/2 |
| 2009/0184389 | A1* | 7/2009 | Bertin et al. | 257/476 |
| 2009/0283735 | A1* | 11/2009 | Li et al. | 257/1 |
| 2010/0006812 | A1* | 1/2010 | Xu et al. | 257/2 |
| 2010/0123116 | A1* | 5/2010 | Ghenciu et al. | 257/4 |
| 2010/0181546 | A1 | 7/2010 | Yamamoto et al. | |
| 2010/0245029 | A1* | 9/2010 | Schricker et al. | 338/13 |
| 2012/0119179 | A1* | 5/2012 | Nakao et al. | 257/2 |

FOREIGN PATENT DOCUMENTS

| | | |
|---|---|---|
| JP | 2006-261677 | 9/2006 |
| JP | 2008-166591 | 7/2008 |

OTHER PUBLICATIONS

Franz Kreupl, et al., "Carbon-Based Resistive Memory", IEDM, Technical Digest, 2008, pp. 521-524.
U.S. Appl. No. 13/052,354, filed Mar. 21, 2011, Nakao, et al.

* cited by examiner

*Primary Examiner* — Benjamin Sandvik
(74) *Attorney, Agent, or Firm* — Oblon, Spivak, McClelland, Maier & Neustadt, L.L.P.

(57) ABSTRACT

A nonvolatile semiconductor memory device in accordance with an embodiment comprises a lower electrode layer, a variable resistance layer, and an upper electrode layer. The lower electrode layer is provided over a substrate. The variable resistance layer is provided on the lower electrode layer and is configured such that an electrical resistance of the variable resistance layer can be changed. The upper electrode layer is provided on the variable resistance layer. The variable resistance layer comprises a carbon nanostructure and metal atoms. The carbon nanostructure is stacked to have a plurality of gaps. The metal atoms are diffused into the gaps.

13 Claims, 4 Drawing Sheets

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from the prior Japanese Patent Application No. 2010-30855, filed on Feb. 16, 2010, the entire contents of which are incorporated herein by reference.

FIELD

Embodiments described in this specification relate to a nonvolatile semiconductor memory device configured to perform data write in a nonvolatile manner, and to a method of manufacturing the nonvolatile semiconductor memory device.

BACKGROUND

In recent years, accompanying the popularization of portable information terminals and digitalization of information, there has been an increasing demand for information recording/reproducing devices or memory devices, that are compact in size and have a large capacity. Especially, NAND type flash memory and compact HDD (Hard Disk Drive) have increased recording density due to the advance of miniaturization technique, and are adopted in various types of devices. However, further increases in recording density and capacity are being demanded. That is, miniaturization, high density and high speed are further required which are unrealizable with conventional techniques. Accordingly, a resistance varying type nonvolatile semiconductor memory configured to record different electrical resistance values as information is receiving attention as an improved device.

The resistance varying type nonvolatile semiconductor memory is configured by a variable resistance layer and electrodes, the electrodes sandwiching the variable resistance layer. The variable resistance layer can take two or more different electrical resistance states, for example, a low-resistance state and a high-resistance state. In the nonvolatile semiconductor memory, the resistance state of the variable resistance layer is caused to change by applying a voltage, current, or charge not less than threshold value between the electrodes, the difference in resistance value being recorded corresponding to data. Furthermore, the nonvolatile semiconductor memory has a feature that the resistance state is non-destructively readable by applying a voltage, current, or charge not more than the threshold value.

Currently undergoing research and development as an element material for the resistance varying type nonvolatile semiconductor memory are multi-component metal oxides such as nickel oxide (NiO) or strontium zirconium oxide ($SrZrO_3$). However, there are difficulties in controlling composition and crystalline structure to manufacture the metal oxides. Moreover, characteristics of the metal oxides are unstable, which makes it difficult to realize desired electrical characteristics of the metal oxides with good reproducibility. Consequently, although R&D for a suitable material for the variable resistance element is under way, an optimal material has yet to be found.

Furthermore, carbon-based materials are also subject to R&D as candidates for the variable resistance layer, and their manufacturing methods. Carbon-based materials are configured by single carbon, and hence have the merit that control of composition is comparatively easy and easily controllable with little dependence on process conditions. However, unless manufactured at high temperature and high pressure, a carbon film tends to be formed as black lead or a so-called graphite structure, leading to low resistivity. Varying of the resistance state is considered to be caused by change in bonding state, that is, change between sp3 bond and sp2 bond, of carbon in the film. Accordingly, a large current is required to change the bonding state.

When a non-volatile memory is configured by arranging memory cells in a matrix, and/or by stacking the memory cells in an integration manner, wirings connected to the memory cells are necessarily long. If an operating current flowing in an individual memory cell in such a memory is large, the voltage drop in the wirings themselves becomes significant. As a result, it becomes impossible to supply the memory cells with the voltage required in an operation. Furthermore, if the wiring resistance is large, a signal caused by change in resistance of the memory cell cannot be detected with high accuracy. That is, as an operation current flowing in an memory cell becomes larger, the size of a cell matrix, and the number of accumulation layers should be smaller. Accordingly, a memory device with a large cell operation current is not suited for high integration. In addition, there is also the problem that current consumption of the device increases.

DETAILED DESCRIPTION

A nonvolatile semiconductor memory device in accordance with an embodiment comprises a lower electrode layer, a variable resistance layer, and an upper electrode layer. The lower electrode layer is provided over a substrate. The variable resistance layer is provided on the lower electrode layer and is configured such that an electrical resistance of the variable resistance layer can be changed. The upper electrode layer is provided on the variable resistance layer. The variable resistance layer comprises a carbon nanostructure and metal atoms. The carbon nanostructure is stacked to have a plurality of gaps. The metal atoms are diffused into the gaps.

A nonvolatile semiconductor memory device in accordance with another embodiment comprises a first line, a second line, and a memory cell. The first line extends in a first direction. The second line extends in a second direction, the second direction differing from the first direction. The memory cell is provided between the first line and the second line. The memory cell comprises a lower electrode layer, a variable resistance layer, and an upper electrode layer. The lower electrode layer is provided over a substrate. The variable resistance layer is provided on the lower electrode layer and is configured such that an electrical resistance of the variable resistance layer can be changed. The upper electrode layer is provided on the variable resistance layer. The variable resistance layer comprises a carbon nanostructure and metal atoms. The carbon nanostructure is stacked to have a plurality of gaps. The metal atoms are diffused into the gaps.

In a method of manufacturing a nonvolatile semiconductor memory device in accordance with yet another embodiment, first, a lower electrode layer is formed over a substrate. Next, a variable resistance layer is formed on the lower electrode layer, the variable resistance layer being configured such that an electrical resistance of the variable resistance layer can be changed. Then, an upper electrode layer is formed on the variable resistance layer. The variable resistance layer is formed by depositing a carbon nanostructure to have a plurality of gaps, and by diffusing metal atoms into the gaps.

Next, embodiments of a nonvolatile semiconductor memory device are described with reference to the drawings.

[Circuit Configuration]

Figure 1:
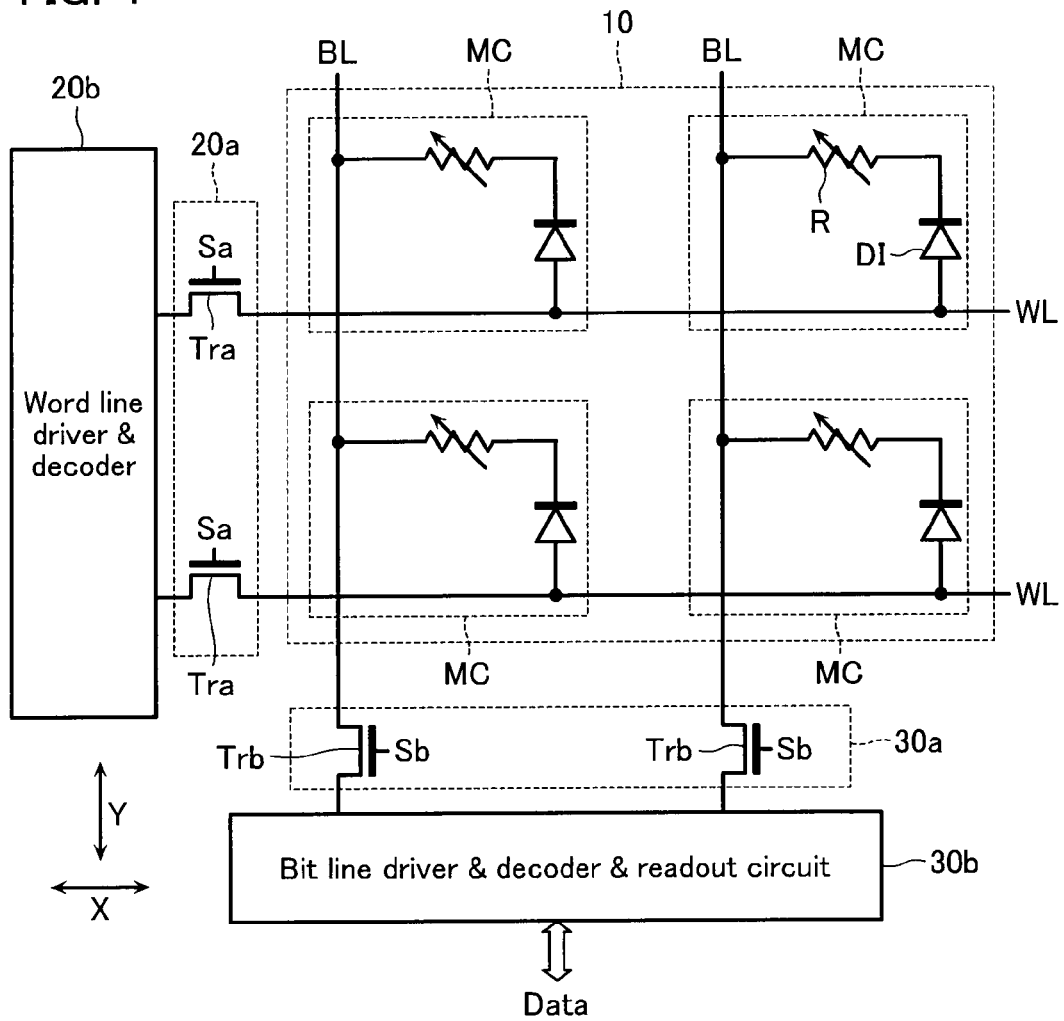
FIG. 1 is a circuit diagram of a nonvolatile semiconductor memory device in accordance with an embodiment.

First, a circuit configuration of a nonvolatile semiconductor memory device in accordance with an embodiment is described with reference to FIG. 1. FIG. 1 is a circuit diagram of the nonvolatile semiconductor memory device in accordance with the embodiment.

As shown in FIG. 1, the nonvolatile semiconductor memory device in accordance with the embodiment includes a memory cell array 10, a word line select circuit 20a, a word line drive circuit 20b, a bit line select circuit 30a, and a bit line drive circuit 30b.

As shown in FIG. 1, the memory cell array 10 includes word lines WL and bit lines BL configured to intersect each other, and memory cells MC disposed at intersections of the word lines WL and the bit lines BL. The word lines WL are formed to extend in an X direction and arranged with a certain pitch in a Y direction. The bit lines BL are formed to extend in the Y direction and arranged with a certain pitch in the X direction. That is, the memory cells MC are disposed in a matrix on a plane formed by the X direction and the Y direction.

As shown in FIG. 1, each of the memory cells MC includes a diode DI and a variable resistance element R. The diode DI has its anode connected to the word line WL and its cathode connected to one end of the variable resistance element R. The variable resistance element R is electrically rewritable and stores data in a nonvolatile manner based on a resistance value of the variable resistance element R. The variable resistance element R has its other end connected to the bit line BL.

As shown in FIG. 1, the word line select circuit 20a includes a plurality of select transistors Tra. The select transistors Tra have one ends connected to one ends of respective word lines WL and the other ends connected to the word line drive circuit 20b. Gates of the select transistors Tra are supplied with a signal Sa. That is, the word line select circuit 20a selectively connects the word lines WL to the word line drive circuit 20b by controlling the signal Sa.

As shown in FIG. 1, the word line drive circuit 20b applies to the word lines WL a voltage required for data erase of the memory cells MC, a voltage required for data write to the memory cells MC, and a voltage required for data read from the memory cells MC.

As shown in FIG. 1, the bit line select circuit 30a includes a plurality of select transistors Trb. The select transistors Trb have one ends connected to one ends of respective bit lines BL and the other ends connected to the bit line drive circuit 30b. Gates of the select transistors Trb are supplied with a signal Sb. That is, the bit line select circuit 30a selectively connects the bit lines BL to the bit line drive circuit 30b by controlling the signal Sb.

As shown in FIG. 1, the bit line drive circuit 30b applies to the bit lines BL a voltage required for data erase of the memory cells MC, a voltage required for data write to the memory cells MC, and a voltage required for data read from the memory cells MC. In addition, the bit line drive circuit 30b outputs data read from the bit lines BL to external.

[Stacking Structure of Memory Cell Array 10]

Figure 2:
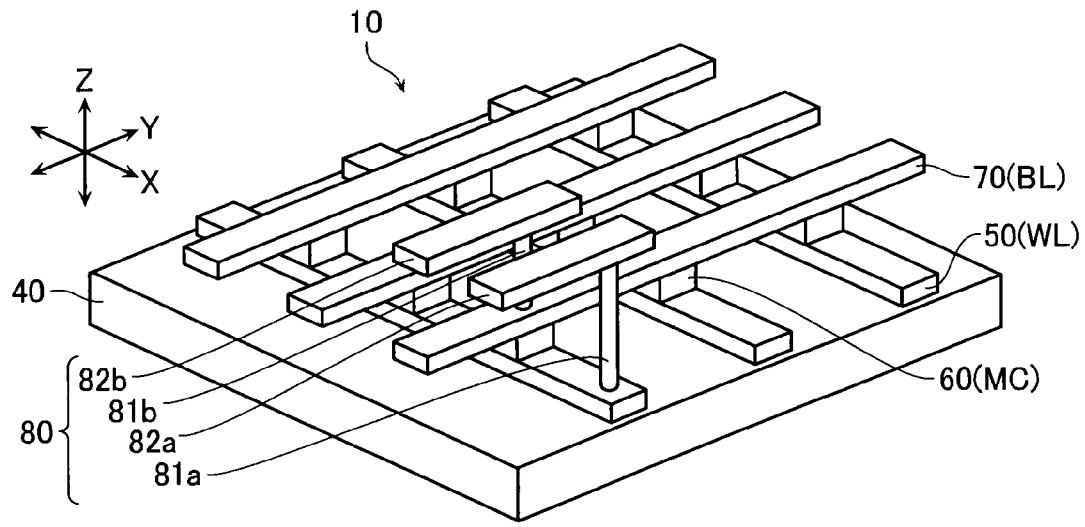
FIG. 2 is an enlarged perspective view of a memory cell array 10 in accordance with the embodiment.

Next, a stacking structure of the memory cell array 10 in accordance with the embodiment is described with reference to FIG. 2. FIG. 2 is an enlarged perspective view of the memory cell array 10 in accordance with the embodiment.

As shown in FIG. 2, the memory cell array 10 is formed in a layer above a substrate 40. The memory cell array 10 includes, from a lower layer to an upper layer, a first conductive layer 50, a memory layer 60, a second conductive layer 70, and a wiring layer 80. The first conductive layer 50 functions as the word lines WL. The memory layer 60 functions as the memory cells MC. The second conductive layer 70 functions as the bit lines BL.

As shown in FIG. 2, the first conductive layer 50 is formed in stripe extending in the X direction and having a certain pitch in the Y direction. The first conductive layer 50 is configured by a metal. The first conductive layer 50 is preferably configured by a heat-resistant material of low resistance value, such as, tungsten (W), titanium (Ti), tantalum (Ta), and their nitrides, or a stacking structure of these metals and nitrides, or the like.

As shown in FIG. 2, the memory layer 60 is provided on the first conductive layer 50, and arranged in a matrix in the X direction and the Y direction.

As shown in FIG. 2, the second conductive layer 70 is formed in stripe extending in the Y direction and having a certain pitch in the X direction. The second conductive layer 70 is formed to be in contact with an upper surface of the memory layer 60. The second conductive layer 70 is preferably configured by a heat-resistant material of low resistance value, such as, tungsten (W), titanium (Ti), tantalum (Ta), and their nitrides, or a stacking structure of these metals and nitrides, or the like.

As shown in FIG. 2, the wiring layer 80 includes first and second plug layers 81a and 81b, and first and second wiring layers 82a and 82b. The first plug layer 81a is formed to extend in a stacking direction from an upper surface of the first conductive layer 50. The second plug layer 81b is formed to extend in the stacking direction from an upper surface of the second conductive layer 70. The first wiring layer 82a is formed to be in contact with an upper surface of the first plug layer 81a. The second wiring layer 82b is formed to be in contact with an upper surface of the second plug layer 81b.

Figure 3:
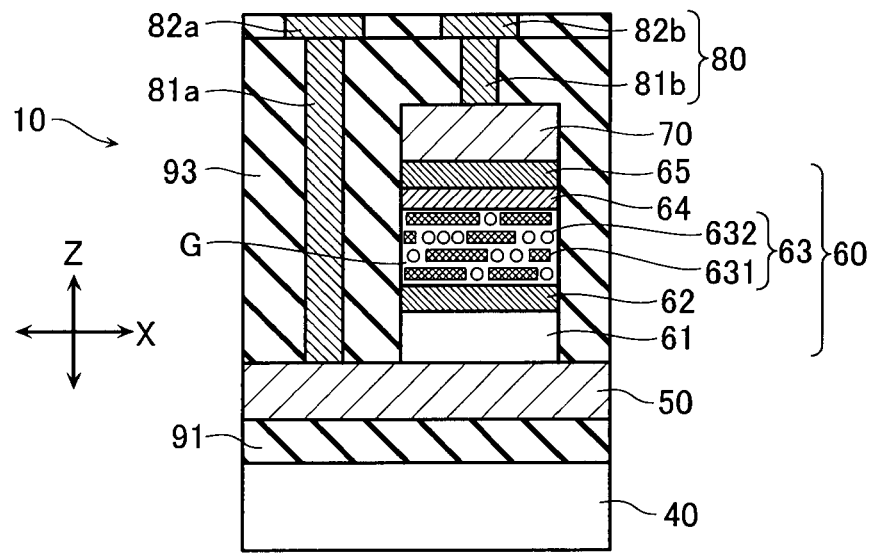
FIG. 3 is a cross-sectional view of FIG. 2.

Next, a detailed stacking structure of each layer is described with reference to FIG. 3. FIG. 3 is a cross-sectional view of FIG. 2.

As shown in FIG. 3, the first conductive layer 50 is formed on the substrate 40 via an interlayer insulating layer 91. The interlayer insulating layer 91 is configured by a silicon oxide film such as TEOS (tetraethyl orthosilicate $Si(OC_2H_5)_4$), BSG (borosilicate glass), or p-$SiO_2$ (plasma oxide film). Alternatively, the interlayer insulating layer 91 may be configured by another insulating film material such as a silicon nitride film.

As shown in FIG. 3, the memory layer 60 includes, from a lower layer to an upper layer, a diode layer 61, a lower electrode layer 62, a variable resistance layer 63, a metal layer 64, and an upper electrode layer 65. The memory layer 60 is covered by an interlayer insulating layer 93.

The diode layer 61 is formed on the upper surface of the first conductive layer 50. The diode layer 61 functions as the diode DI. The diode layer 61 is configured by, for example, a MIM (Metal-Insulator-Metal) structure, a PIN (P+poly-Silicon-Intrinsic-N+poly-Silicon) structure, or the like.

The lower electrode layer 62 is formed on an upper surface of the diode layer 61. The lower electrode layer 62 is configured by a metal, for example, any of titanium (Ti), zirconium (Zr), hafnium (Hf), tantalum (Ta), tungsten (W), aluminum (Al), silicon (Si), ruthenium (Ru), iridium (Ir), and platinum (Pt), by an alloy of these metals, a metal silicide, a metal nitride, or a metal silicate.

The variable resistance layer 63 is formed on an upper surface of the lower electrode layer 62. The variable resistance layer 63 is configured such that its electrical resistivity can be changed by at least any one of an applied voltage, a passed current, or an injected charge. The variable resistance layer 63 comprises a carbon nanostructure 631 stacked to have a plurality of gaps G, and a minute quantity of metal atoms 632 diffused into the gaps G.

The carbon nanostructure 631 is a carbon nanomaterial, for example, a carbon nanotube (including single-wall, double-wall, and multi-wall), fullerene, stacked graphene, a carbon nano ribbon, or the like. The carbon nanostructure 631 has a three-dimensional structure, and differ in this respect from a carbon film which has a film-like planar structure. As a result, a current path in the carbon nanostructure 631 is spatially limited, and an amount of current flowing in the carbon nanostructure 631 is smaller compared to the carbon film, even if both are of the same carbon-based material. Filling rate of the carbon nanostructure 631 is determined by their molecular structure and density.

Whether one single-layer carbon nanotube behaves like metal or semiconductor depends on how a graphene sheet included therein is wound. However, unless carbon nanotubes of different electrical conductivity types are purposely separated, an assembly of single layer carbon nanotubes having a net-like configuration behaves as a conductor. Moreover, a mixture of single layer nanotubes and multilayer nanotubes also behaves substantially as a conductor.

The carbon nanostructure 631 is configured in a net-like and stacked manner, and is arranged in a direction parallel to the substrate 40 (in a direction parallel to an upper surface or lower surface of the lower electrode layer 62 or upper electrode layer 64). That is, the carbon nanostructure 631 is not arranged in the stacking direction (direction orthogonal to the upper surface or lower surface of the lower electrode layer 62 or upper electrode layer 64). This is because if the carbon nanostructure 631 is disposed to directly electrically connect the lower electrode layer 62 and the upper electrode layer 64, electrical conductivity of the variable resistance layer 63 is constantly high, leading to a large current flowing in the variable resistance layer 63.

Now, a carbon nanotube has a structure extending linearly in its axis direction. Consequently, one carbon nanotube, or an aggregate carbon nanotubes as a bundle of carbon nanotubes have characteristics of a high conductivity material in that axis direction. However, an assembly of carbon nanotubes in which the individual carbon nanotubes intertwine with each other and point in different directions shows characteristics of a low conductivity material. That is, when the carbon nanostructure 631 which is a conductor, intertwines with certain gaps G and contact points of those gaps G are joined to allow formation of a conducting path, the electrical resistance increases. If density of the carbon nanostructure 631 is raised thereby increasing the number of contact points, the electrical resistance falls. On the other hand, if density of the carbon nanostructure 631 is lowered thereby decreasing the number of contact points, the conducting path is reduced and the electrical resistance rises. If an insulator is included in the gaps G in the net-like carbon nanostructure 631, the number of contact points forming the conducting path is reduced thereby allowing the electrical resistance to be raised.

If a voltage is applied between the electrodes while the variable resistance layer 63 is in the high-resistance state, the metal atoms 632 are attracted by the electric field to be diffused via the gaps G. The diffused metal atoms 632 mutually connect the carbon nanostructure 631 to form a conducting path, whereby the variable resistance layer 63 attains the low-resistance state. At this time, in order to mobilize the metal atoms 632, a long pulse voltage having a voltage application time of about 1 μs is preferably applied. On the other hand, if a voltage is applied between the electrodes while the variable resistance layer 63 is in the low-resistance state, a large current flows, and the metal atoms 632 are mobilized by generation of joule heat. This causes the conducting path to be severed, whereby the variable resistance layer 63 once again attains the high-resistance state. At this time, in order to prevent heat destruction of the element due to large current flow and to prevent regeneration of the conducting path due to excessive diffusion of the metal atoms 632, a short pulse voltage having a voltage application time of less than 1 μs is preferably applied.

The metal layer 64 is formed on an upper surface of the variable resistance layer 63. The metal layer 64 is configured by a metal such as titanium. A portion of the metal layer 64 is diffused in a manufacturing process to be described hereafter or during a voltage application, thereby forming the metal atoms 632.

The film thickness of the metal layer 64 depends on the atomic radius of the element configuring the metal layer 64 and also on the density of the variable resistance layer 63. In the case of titanium, the metal layer 64 preferably has a film thickness of about 1 nm with respect to a variable resistance layer 63 of approximately 50 nm. This is because, if the film thickness of the metal layer 64 is large, excessive metal atoms 632 are supplied to the variable resistance layer 63, causing the resistivity of the variable resistance layer 63 to fall to less than a desired value. Moreover, if density of the variable resistance layer 63 is low, the film thickness of the metal layer 64 needs to be reduced. This is because, a low density variable resistance layer 63 has many gaps in the carbon nanostructure 631, causing greater diffusion of the metal atoms 632 in the variable resistance layer 63.

The upper electrode layer 65 is formed on an upper surface of the metal layer 64. The upper electrode layer 65 is formed to have its upper surface in contact with a lower surface of the second conductive layer 70. The upper electrode layer 65 is configured by a metal nitride such as titanium nitride or tungsten nitride. The metal nitride, in addition to being a conductor, is also capable of having its film characteristics, particularly film stress, controlled by changing the amount of contained nitrogen. Changing the metal and nitrogen composition and the crystalline system of the upper electrode layer 65 allows film stress of the upper electrode layer 65 to be controlled downwardly and film peeling to be prevented. Configuration of the upper electrode layer 65 by a metal nitride results in a larger number of process parameters compared to the case of an elemental metal, and allows characteristics of the electrode layer 65 to be sufficiently controlled.

The first and second plug layers 81a and 81b are formed to penetrate the interlayer insulating layer 93. The first plug layer 81a is formed to reach the upper surface of the first conductive layer 50. The second plug layer 81b is formed to reach the upper surface of the second conductive layer 70.

[Method of Manufacturing]

Figure 4:
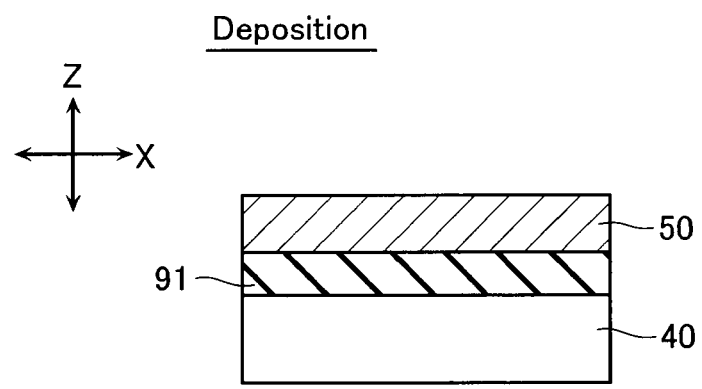
FIG. 4 is a schematic view showing a manufacturing process of the nonvolatile semiconductor memory device in accordance with the embodiment.
Figure 5:
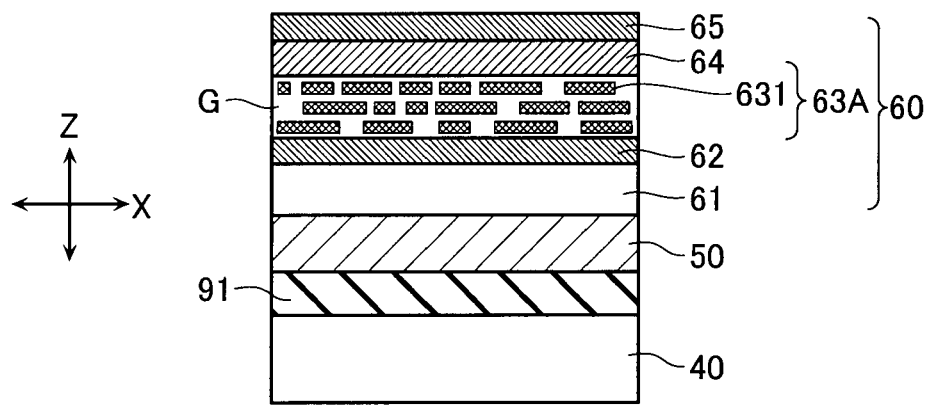
FIG. 5 is a schematic view showing a manufacturing process of the nonvolatile semiconductor memory device in accordance with the embodiment.
Figure 6:
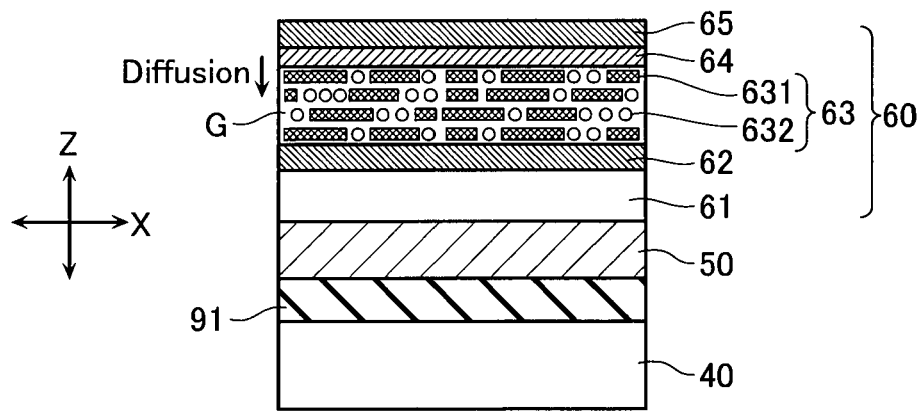
FIG. 6 is a schematic view showing a manufacturing process of the nonvolatile semiconductor memory device in accordance with the embodiment.

Next, a method of manufacturing a nonvolatile semiconductor memory device in accordance with the embodiment is described with reference to FIGS. 4-6. FIGS. 4-6 are schematic views showing manufacturing processes of the nonvolatile semiconductor memory device in accordance with the embodiment.

First, as shown in FIG. 4, TEOS is deposited on the substrate 40 to form the interlayer insulating layer 91. The substrate 40 is configured by silicon (Si). Subsequently, titanium (Ti) is deposited on the interlayer insulating layer 91 to form the first conductive layer 50.

Then, as shown in FIG. 5, the diode layer 61, the lower electrode layer 62, a layer 63A, the metal layer 64, and the upper electrode layer 65 are deposited sequentially on the first conductive layer 50.

The layer 63A is formed, for example, by using a CVD method to deposit the carbon nanostructure 631 to have a plurality of gaps G therein. The carbon nanostructure 631 is carbon nanotubes or the like. The metal layer 64 is formed, for example, by performing sputtering of a metal titanium target to deposit titanium on the layer 63A. The upper electrode layer 65 is formed, for example, by performing sputtering of a metal titanium target in an atmosphere of nitrogen plasma or the like to deposit titanium nitride (TiN) on the metal layer 64.

Now, it is desirable to form the metal layer 64 (metal) prior to the upper electrode layer 65 (titanium nitride) on the layer 63A. The reason may be explained as follows. The carbon nanostructure 631 included in the layer 63A is configured from carbon, such as carbon nanotubes. Accordingly, the layer 63A has a low process tolerance against an oxygen atmosphere. That is, if the layer 63A (carbon nanostructure 631) and oxygen come in contact, it is easy for the carbon and oxygen to combine (oxidization), whereby the carbon nanostructure 631 vaporizes. If this oxidization occurs at the interface of the layer 63A and the lower electrode layer 62, the layer 63A is easily peeled. In general, metal electrodes are easily oxidized, it includes oxygen particularly in its surface. The surface of the lower electrode layer 62 gets oxidized, before the carbon nanostructure 631 is formed. The lower electrode layer 62 is in contact with the carbon nanostructure 631 formed in a stacked manner thereon, with oxygen included at the interface. When metal nitride is used for the upper electrode 65, and the metal electrodes are exposed to a highly reactive gas such as nitrogen plasma which is used for deposition. The metal electrode of the lower electrode is nitrided and, at the same time, oxygen is released. Then, the released oxygen is reacted with the carbon to deteriorate the film strength of the layer 63A. That is, although it is desirable to use a metal nitride for the upper electrode layer 65, a problem is caused by the nitrogen radicals occurring in the formation process of that upper electrode layer 65. Accordingly, in the present embodiment, sputtering that does not require nitrogen plasma is performed to deposit the metal layer 64 (metal) prior to depositing the upper electrode layer 65 (metal nitride). This overcomes process-related problems such as deterioration of film strength and film peeling. Furthermore, density of the carbon nanostructure 631 is preferably set high in order to prevent short-circuiting between upper and lower electrodes due to spikes (deposition of metal) caused by pinhole defects in the carbon nanostructure 631. On the other hand, since a certain amount of gaps G must be left in the carbon nanostructure 631, density of the carbon nanostructure 631 is preferably not less than 1.5 g/cm$^3$ and not more than 2.5 g/cm$^3$. Alternatively, in order to resolve the above-described short-circuiting-related problem, it is desirable that crystals in the metal layer 64 and upper electrode layer 65 have orientations that are insufficiently aligned (be made non-directional). Now, directionality of the deposited layers is determined by mean free path of sputter atoms during manufacturing. Hence, in order to deposit a non-directional metal layer 64 and upper electrode layer 65, sputtering is preferably performed at high pressure. For example, and a vacuum condition of 40 Pa or more is preferable.

Next, annealing (at approximately 700° C.) is executed, thereby diffusing a portion of the metal layer (metal atoms 632) into the gaps G of the carbon nanostructure 631 included in the layer 63A, as shown in FIG. 6. This results in the variable resistance layer 63 being formed. Now, the layer 63A (variable resistance layer 63) including the carbon nanostructure 631 has good resistance to heat processing compared to other insulator-configured porous materials, and does not reduce in volume even under heat processing at approximately 700° C.

Following FIG. 6, the second conductive layer 70 is formed, and then the first conductive layer 50, diode layer 61, lower electrode layer 62, variable resistance layer 63, metal layer 64, upper electrode layer 65, and second conductive layer 70 are processed in a certain pattern. Performing of these processes results in the memory layer 60 being formed.

[Advantages]

The variable resistance layer 63 in accordance with the embodiment includes the carbon nanostructure 631 and the metal atoms 632. The variable resistance layer 63 can thus be miniaturized due to the carbon nanostructure 631. That is, the nonvolatile semiconductor memory device in accordance with the embodiment can have its occupied area reduced. Furthermore, the metal atoms 632 are provided between the carbon nanostructure 631 and can therefore be easily mobilized to the lower electrode layer 62 or upper electrode layer 64 through application of a voltage to the variable resistance layer 63. That is, the nonvolatile semiconductor memory device in accordance with the embodiment can execute operations of write, erase, and so on, while suppressing power consumption. For example, when the variable resistance layer 63 is configured by a membrane-like carbon film, a grain boundary can be formed in the carbon film by heat processing, and titanium atoms implanted in that grain boundary. However, in such a case, the titanium atoms are not mobilized and the resistance value of the variable resistance layer 63 does not change, even if an electric field is applied to the variable resistance layer 63.

Other Embodiments

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the above-described embodiment, the memory layer 60 has only one layer shown, but the memory layer 60 may be stacked, thereby allowing the occupied area to be further reduced.

Figure 7:
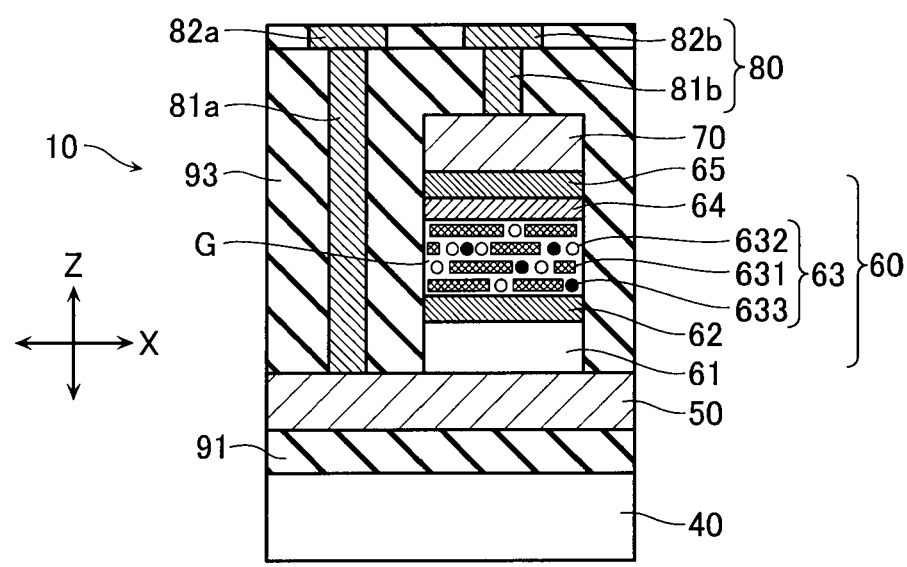
FIG. 7 is a cross-sectional view showing a memory layer 60 in accordance with another embodiment.

For example, as shown in FIG. 7, the variable resistance layer 63 of the present embodiment may include insulators 633 diffused into the gaps G. Such a configuration allows the number of contact points forming the conducting path to be reduced due to the insulators 633, thereby enabling electrical conductivity of the variable resistance layer 63 to be controlled. In addition, filling the gaps G of the carbon nanostructure 631 by the insulators 633 allows diffusion of the metal atoms 632 to be suppressed and controlled. Furthermore, suppressing the spikes caused by minute pinhole defects in the carbon nanostructure 631 during formation of the upper electrodes allows short-circuiting between the upper and lower electrodes to be prevented.

For example, the process shown in FIG. 6 may be a process that passes a current through the layer 63A and metal layer 64 thereby generating joule heat, without executing annealing.

What is claimed is:

1. A nonvolatile semiconductor memory device, comprising:
    a lower electrode layer provided over a substrate;
    a variable resistance layer provided on the lower electrode layer and configured such that an electrical resistance of the variable resistance layer can be changed; and
    an upper electrode layer provided on the variable resistance layer,
    the variable resistance layer comprising:
    carbon nanostructures configured in a net-like manner and stacked to form a plurality of layers, the layers being arranged in a parallel direction with respect to the substrate to form a plurality of gaps therein; and
    metal atoms provided in the gaps,
    wherein at least one of the metal atoms is disposed completely within the gaps between ends of the net-like carbon nanostructures in the layers and is completely surrounded by the carbon nanostructures.

2. The nonvolatile semiconductor memory device according to claim 1,
    wherein the variable resistance layer further comprises insulators, the insulators being provided in the gaps.

3. The nonvolatile semiconductor memory device according to claim 1,
    wherein the carbon nanostructures include any of a carbon nanotube, fullerene, and graphene.

4. The nonvolatile semiconductor memory device according to claim 1,
    wherein the upper electrode layer is configured by a metal nitride.

5. The nonvolatile semiconductor memory device according to claim 1, further comprising a metal layer provided between the variable resistance layer and the upper electrode layer.

6. The nonvolatile semiconductor memory device according to claim 1,
    wherein the lower electrode layer is configured by a metal, an alloy, a metal silicide, a metal nitride or a metal silicate.

7. The nonvolatile semiconductor memory device according to claim 3,
    wherein the carbon nanotube includes a single-wall carbon nanotube, a double-wall carbon nanotube, and a multi-wall carbon nanotube.

8. The nonvolatile semiconductor memory device according to claim 1, further comprising a diode layer provided below the lower electrode layer and configured to function as a diode.

9. The nonvolatile semiconductor memory device according to claim 8,
    wherein the diode layer is configured by a MIM structure or a PIN structure.

10. A nonvolatile semiconductor memory device, comprising:
    a first line extending in a first direction;
    a second line extending in a second direction, the second direction differing from the first direction; and
    a memory cell provided between the first line and the second line,
    the memory cell comprising:
    a lower electrode layer provided over a substrate;
    a variable resistance layer provided on the lower electrode layer and configured such that an electrical resistance of the variable resistance layer can be changed; and
    an upper electrode layer provided on the variable resistance layer, and
    the variable resistance layer comprising:
    carbon nanostructures configured in a net-like manner and stacked to form a plurality of layers, the layers being arranged in a parallel direction with respect to the substrate to form a plurality of gaps therein; and
    metal atoms provided in the gaps,
    wherein at least one of the metal atoms is disposed completely within the gaps between ends of the net-like carbon nanostructures in the layers and is completely surrounded by the carbon nanostructures.

11. The nonvolatile semiconductor memory device according to claim 10,
    wherein the variable resistance layer further comprises insulators, the insulators being provided in the gaps.

12. The nonvolatile semiconductor memory device according to claim 10,
    wherein the carbon nanostructures include any of a carbon nanotube, fullerene, and graphene.

13. The nonvolatile semiconductor memory device according to claim 10,
    wherein the upper electrode layer is configured by a metal nitride.

* * * * *